United States Patent [19]
Corby et al.

[11] 3,957,614
[45] May 18, 1976

[54] APPARATUS FOR TREATING PORTIONS OF ARTICLES

[75] Inventors: William Joseph Corby, Allentown; Edward Stephen Figuli, Emmaus; Earl Dallas Winters, Quakertown, all of Pa.

[73] Assignees: Western Electric Company, Inc.; Bell Telephone Laboratories, Incorporated, both of New York, N.Y.

[22] Filed: May 9, 1975

[21] Appl. No.: 576,395

Related U.S. Application Data

[62] Division of Ser. No. 426,744, Dec. 20, 1973, Pat. No. 3,894,918.

[52] U.S. Cl. ............................. 204/224 R; 204/228
[51] Int. Cl.² .................. C25D 17/28; B65G 49/00
[58] Field of Search ................... 204/15, 224 R, 228

[56] References Cited
UNITED STATES PATENTS

| | | | |
|---|---|---|---|
| 2,967,813 | 1/1961 | Lindsay | 204/224 R |
| 3,137,645 | 6/1964 | Vaughan et al. | 204/15 |
| 3,723,283 | 3/1973 | Johnson et al. | 204/224 R |
| 3,745,105 | 7/1973 | Kosowsky et al. | 204/224 R |
| 3,860,499 | 1/1975 | Graham et al. | 204/15 |

*Primary Examiner*—T. M. Tufariello
*Attorney, Agent, or Firm*—R. Y. Peters

[57] ABSTRACT

In making semiconductive devices using lead frames, savings in gold result from plating spot layers of gold on the free ends of the leads of the frames where substrates are to be bonded. To accomplish such plating, a plating bath is flowed out of each orifice of laterally aligned plating tubes. A strip of interconnected lead frames is then moved past a sensing device to produce a control signal and then past the orifices and into contact with the plating bath. As the frames are moved past the orifices, the plating bath is sequentially rendered effective in response to the control signal to plate with the bath the spots of the frames in contact with the bath while the bath is so rendered effective, whereby the remainder of the frames are not plated.

6 Claims, 5 Drawing Figures

APPARATUS FOR TREATING PORTIONS OF ARTICLES

This is a division of application Ser. No. 426,744, filed Dec. 20, 1973, now U.S. Pat. No. 3,894,918.

BACKGROUND OF THE INVENTION

1. Field of the Invention

This invention relates to apparatus for treating portions of articles, and more particularly, to apparatus for spot electroplating layers of metals on conductive articles.

This invention is suited for use in the manufacture of semiconductive devices such as transistors, diodes, integrated circuits and the like. It is particularly suited for electroplating gold layers on portions of nickel or copper lead frames that may be used for semiconductor devices, such as integrated circuit chips which may be bonded to gold-patterned ceramic substrates. However, this invention is also equally well suited for other treating applications, such as those involving electrochemical action, anodizing, polishing, cleaning or the like, wherein the treatment of a small portion of an article is desired.

2. Description of the Prior Art

In the manufacture of integrated circuits, leads of each of a plurality of integrated circuit chips are bonded individually to gold conductive patterns formed on insulating ceramic substrates. In order to connect these patterns to other circuits, leads are connected to these patterns and are often formed from a lead frame stamped from a sheet of conductive metal such as nickel, copper or the like. The lead frame has a separate group of leads for each conductive pattern of each substrate, and these leads are bonded to the substrate. Each group has the outer ends of each lead interconnected to carrier strips and their opposed inner free ends bonded to the conductive pattern of each substrate. The leads are also interconnected intermediate their ends by relatively narrow support strips. The carrier strips have outer portions perforated for feeding them through various treating operations. Both the carrier and support strips are severed to separate the individual leads prior to the completion of the ultimate integrated circuits.

In the prior art techniques, a layer of gold has often been formed over the entire lead frame by electroless or electroplating. The purpose of such gold layer is to improve any bonds made to the lead frame. In other prior art techniques, a nonuniform layer of gold has been formed over the entire lead frame with the greatest thickness being concentrated at those portions of the frame where the bonding of an integrated circuit chip or other semiconductive device is to take place. (See Rackus et al. U.S. Pat. No. 3,692,638.) Since the carrier and support strips are ultimately trimmed away it is desirable to have no gold on them. Since the substrates are bonded to the inner free ends of the leads, it is desirable to have a gold layer thereon to improve bondability. Since no substrates are bonded to the remainder of the leads, a gold layer thereon is not necessary. The absence of gold on these strips eliminates expensive and time-consuming reclamation processes to recover the gold from these strips. The absence of gold everywhere except where substrate bonding is to take place can result in a very desirable efficient use and substantial savings of gold.

In treating the lead frames by plating or similar techniques, it is also desirable to carry out such treatment while the frames are advancing in a continuous motion. This can result in treating at great speeds and increase the output of the treating facilities.

Finally, it is also desirable to bring about selective or spot treatment, including plating, without the use of any masks. The elimination of masks often simplifies the treating processes and eliminates any mask replacement or cleaning steps.

SUMMARY OF THE INVENTION

It is, therefore, an object of this invention to provide new and improved apparatus for treating portions of articles.

Another object of this invention is the provision of apparatus for spot electroplating layers of metals on conductive articles.

With these and other objects in view, the present invention contemplates a new apparatus for treating a portion of an article, which includes a treating member having an orifice and facilities for flowing a treating medium out of the orifice. The apparatus also includes a sensing device for producing a control signal. Other facilities are provided for moving the article past the sensing device to produce the control signal and then past the orifice and into contact with the treating medium. Other facilities responsive to the control signal are provided for sequentially rendering effective the treating medium to treat with the medium the portion of the article in contact with the medium while the medium is so rendered effective, whereby the remainder of the article is not treated.

BRIEF DESCRIPTION OF THE DRAWINGS

Other objects and advantages of the present invention may be more clearly understood by reference to the following detailed description and drawing wherein:

FIG. 2 is a side elevational view of the overall apparatus of the present invention for treating portions of the lead frame of FIG. 1 by electroplating or the like;

DETAILED DESCRIPTION

Lead Frame

Figure 1:
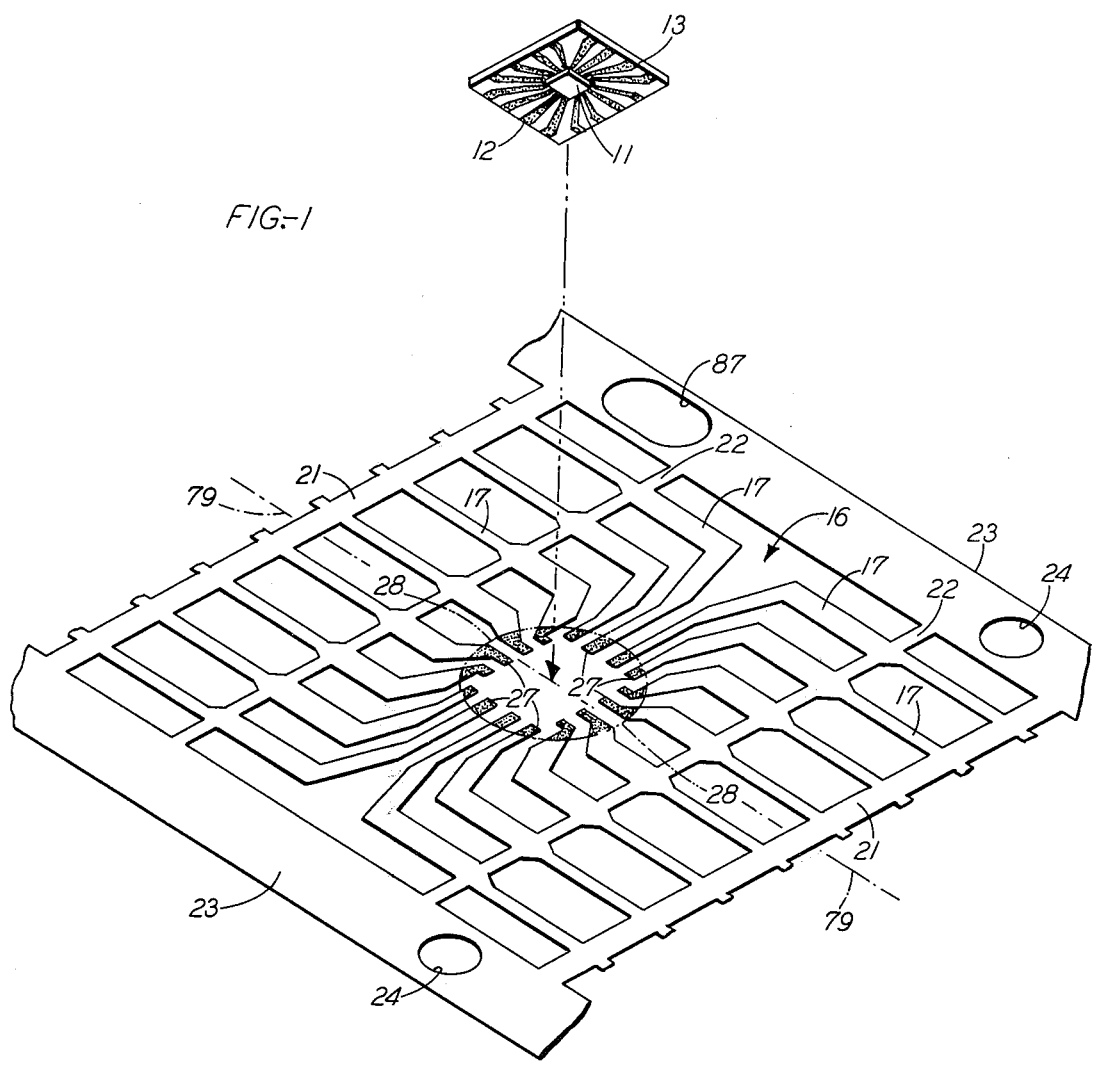
FIG. 1 is an enlarged perspective view of a lead frame, showing a plurality of leads interconnected by perforated carrier strips and relatively narrow support strips, showing portions of the leads that have been treated in accordance with the present invention, and showing an integrated circuit chip bonded to a conductive pattern of a ceramic substrate which is to be bonded to the treated portions of the leads.

Referring now to the drawing and in particular to FIG. 1, an integrated circuit chip 11 is shown bonded to a gold conductive pattern 12 which is formed on an insulating ceramic substrate 13. Also, shown in FIG. 1 is a lead frame, designated generally by the numeral 16, for the substrate 13. The frame 16 has a group of leads 17 which have outer ends interconnected to outer support strips 21 and which also have free ends. The leads 17 are also interconnected by relatively narrow, intermediate support strips 22. The ends of the support strips 21 and 22 are joined to carrier strips 23. Preferably, a plurality of the frames 16 are interconnected into a strip of indefinite length by way of their leads 17, the support strips 21 and 22, and the carrier strips 23; although for convenience only one such frame 16 is shown in FIG. 1. Perforations 24 are formed in the carrier strips 23 to enable the lead frames 16 to be conveniently handled by and automatically fed into, various treating facilities.

After the lead frame 16 shown in FIG. 1 is treated in accordance with the present invention, the substrate 13 is bonded to it and the strips 21, 22 and 23 are severed from it to separate the leads 17 from each other. The leads 17 then are able to connect the substrate 13 and integrated circuit chip 11 thereon to other circuitry (not shown).

Typically, the lead frames 16 are stamped from a copper sheet (with trace amounts of silver in the order of about 12 oz. per ton) which is about 10 mils thick. They are usually preplated with a nickel layer which is about 15 to 30 microinches thick. The nickel layer prevents the copper from diffusing into subsequently formed gold layers. The frames 16 are substantially planar in configuration and are pliable enough to be rolled up lengthwise about a 3 inch radius without damaging them. Advantageously, a very thin layer of gold (commonly referred to as a "flash" layer), in the order of about 10 microinches may be formed at a relatively high voltage over the entire lead frames 16 to improve the adhesion of subsequently formed relatively thick gold layers and to improve the solderability of the frame 16.

Method and Apparatus

In accordance with the method and apparatus of the present invention, an article, such as the lead frame 16 shown in FIG. 1 is treated. While the treatment may be any of a number of different ones, such as electrochemical action, anodizing, polishing, cleaning, or the like; illustratively, the present invention will be described with respect to electroplating. However, it is to be understood that treatments other than electroplating are within the spirit and scope of the invention.

More specifically, a spot layer 27 (FIG. 1) of a metal, such as gold or the like, is electroplated in accordance with this invention on the surface of each of the free ends of the leads 17 of the frame 16. These surfaces, considered as a group, typically have the configuration of a circular area 28. Such electroplating improves the bondability of the substrate 13 to the frame 16. Significantly the electroplating is selective inasmuch as it is carried out only on the free ends of the leads 17, that is, on the area 28.

Plating Bath

Figure 2:
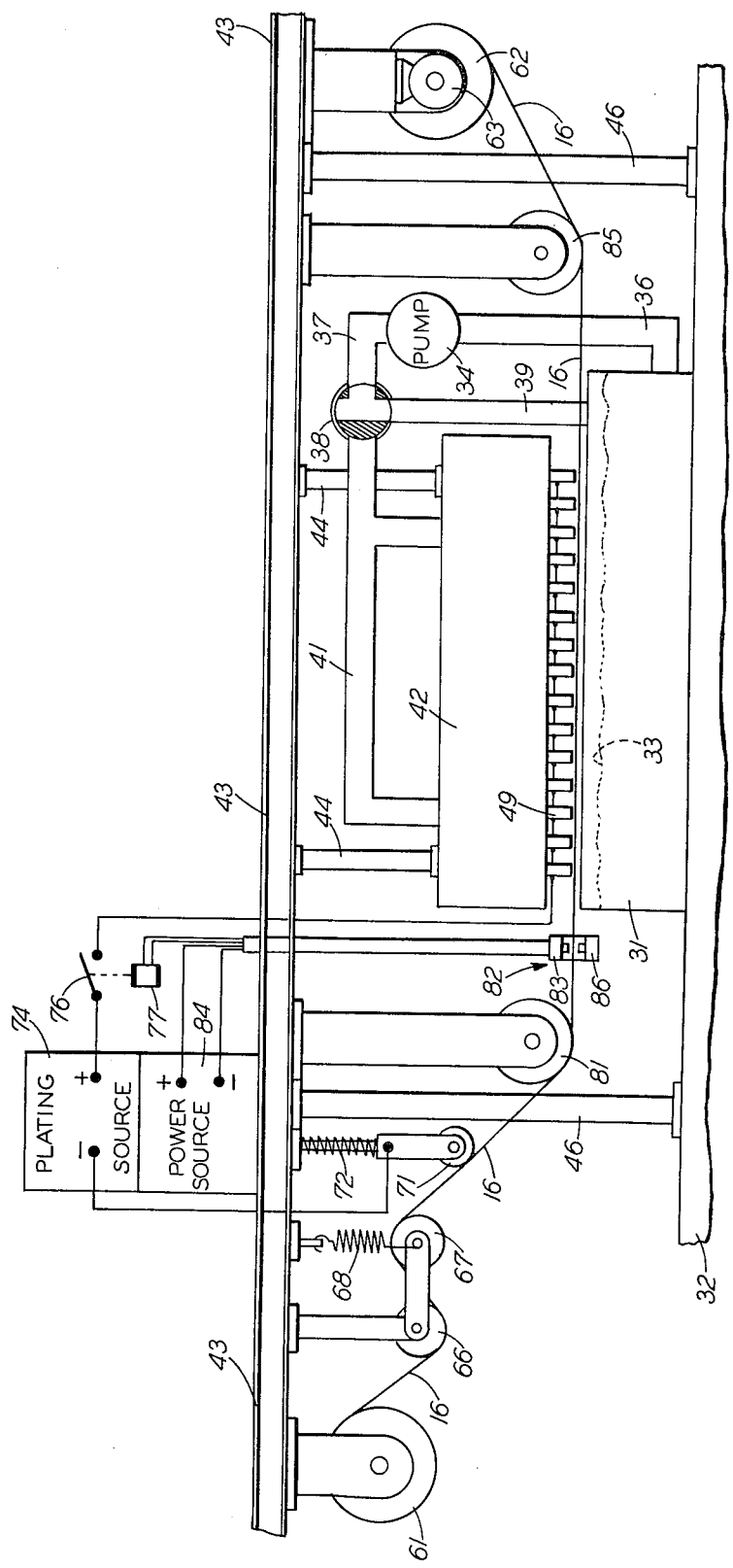

Referring now to FIG. 2, there is shown an apparatus for electroplating a plurality of spot layers 27 (FIG. 1) on an indefinite length of interconnected lead frames 16. The apparatus includes a collecting device such as a tank 31, which as a matter of convenience may be open, supported on a base 32. The tank 31 holds a treating medium which illustratively is a bath 33 for electroplating a metal, such as gold, to form the spot layer 27 on a conductive article, such as the lead frame 16 which typically may be formed of nickel-plated copper.

The bath 33 may be an acidic plating solution based on ammonium citrate and potassium gold cyanide, and may, by way of example, include 100 grams per liter of dibasic ammonium citrate, 100 grams per liter of dibasic ammonium sulfate, and 40 grams per liter of potassium gold cyanide.

Bath Circulating System

In forming the spot layers 27 (FIG. 1) on the lead frames 16, a pump 34 (FIG. 2) is energized to flow the plating bath 33 from the tank 31 and through a circulating system including an arrangement of conduits 36, 37, a valve 38 (normally positioned as shown in FIG. 2) and a conduit 39. This flow maintains a prime on the pump 34.

Next, the valve 38 of the circulating system is operated to rotate it to close the conduit 39 and connect the conduit 37 to another conduit 41 of the system. This flows the bath 33 into a manifold 42 of the system which is conventionally held by a channel 43 by an arrangement of supports 44. The channel 43, in turn, is conventionally mounted to the base 32 by another arrangement of supports 46.

Plating Tubes

From the manifold 42 (FIG. 2) the bath 33 flows through a plurality of parallel plating members or tubes 49 and then back into the tank 31. Both the manifold 42 and the tubes 49 are preferably formed from insulating material, such as that sold under the trademark "Teflon."

Figure 3:
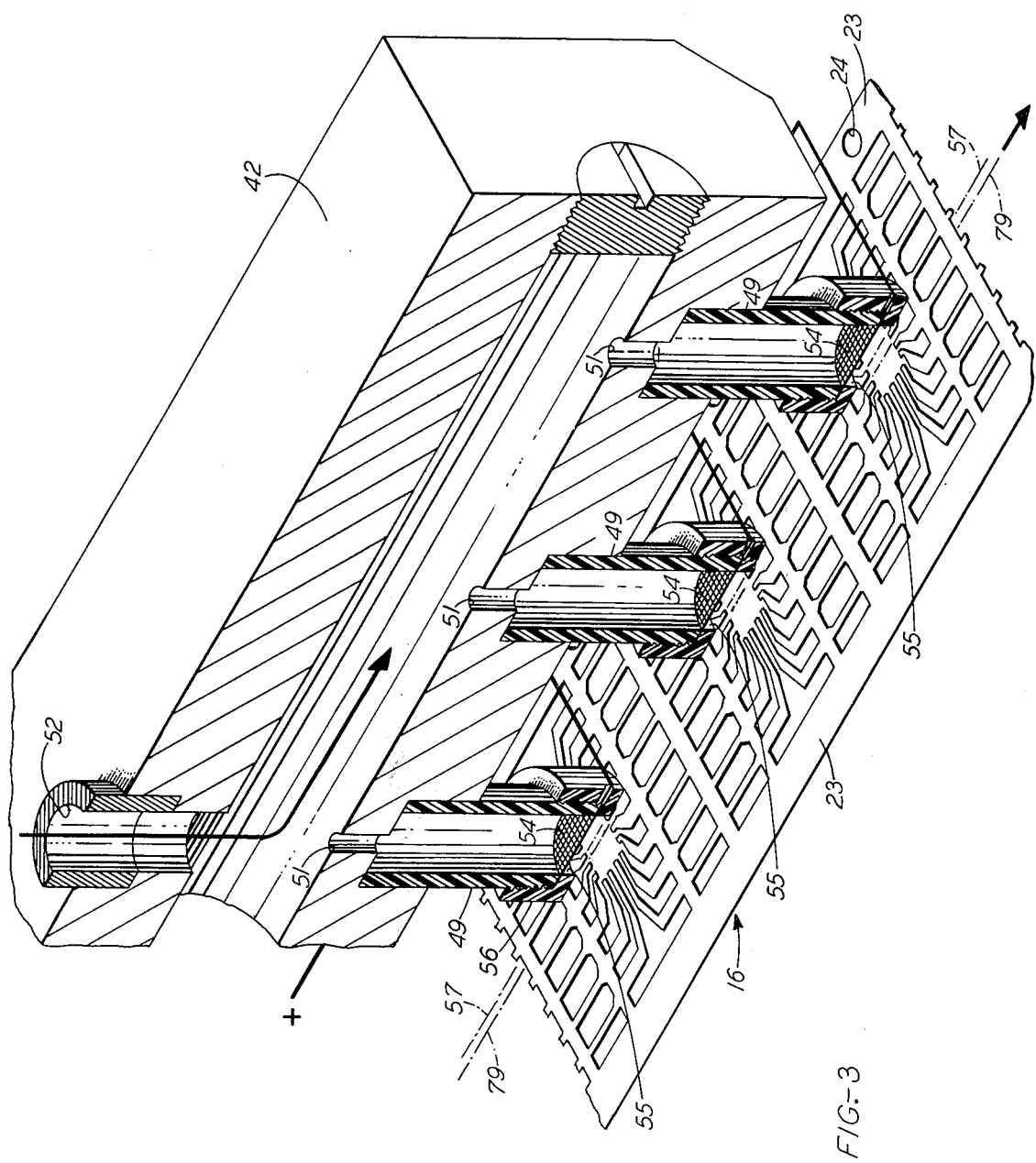
FIG. 3 is an enlarged perspective view, partially cut away and in partial section, of a plurality of treating tubes positioned over portions of a plurality of interconnected lead frames to treat such portions.

Referring now to FIG. 3, a portion of the manifold 42 is shown enlarged and partially cut away to better illustrate the invention. In this figure it can be seen that the plating bath 33 in flowing through the circulating system, actually passes through a plurality of apertures 51 formed in the manifold 42. These apertures 51 have diameters that increase with their spacing from a plurality of inlets 52 (only one of which is shown in FIG. 3). This variance in the diameters of the apertures 51 results in substantially the same flow and pressure of the bath 33 in each plating tube 49. Typically, the flow out of each tube 49 is about 3.1 liters per minute.

In flowing through the plating tubes 49, the bath 33 passes through an anode screen 54 located at the free end of each tube 49 and then out of an orifice 55 at each such free end. The anode screens 54 are formed of a noncorrosive conductive material, such as platinum or the like, and may be mounted in the orifices 55 by any conventional expedients, such as caps 56 formed of "Teflon" and threaded to the ends of the tubes 49. In the alternative, the plating tube 49 or the caps 56 or both of them may be constructed of noncorrosive conducting material and may, therefore, constitute the anode connection for the apparatus.

The tubes 49 are laterally aligned along an axis 57 that passes centrally through the orifices 55 which have substantially the same configuration as the spot layers 27 are to have after the completion of the electroplating operation. Also the tubes 49 are spaced from each other a distance equal to the spaces between the spot layers 27 that are to be formed. Typically, this distance is about 0.83 inches.

Advancing Interconnected Lead Frames

Referring back to FIG. 2, the indefinite length of interconnected lead frames 16 is shown rolled up on a supply reel 61 which is conventionally mounted to the channel 43. Also conventionally mounted to the channel 43 is a reel 62 driven by any conventional expedient, such as a motor 63 for advancing the frames 16 through the entire apparatus of FIG. 2 and for rolling up the frames 16 after they have been selectively electroplated.

In carrying out the invention, the motor 63 is energized to advance the interconnected lead frames 16 under a guide roller 66, conventionally mounted to the channel 43, and over a tension roller 67. The roller 67 is pivotally mounted to the roller 66 and resiliently mounted to the channel 43 by any conventional tensioning means, such as a spring 68.

Next, the interconnected lead frames 16 are advanced into engagement with an electrical contacting roller 71, mounted to the channel 43 using conventional expedients including, among other things, a compression spring 72. The spring 72 forces the roller 71 against the interconnected frames 16 to thereby provide good electrical contact between the roller 71 and the frames 16.

Figure 4:
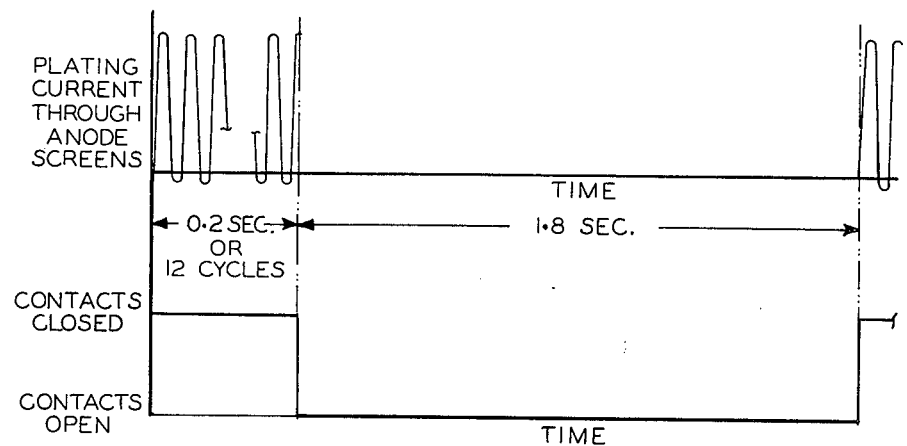
FIG. 4 illustrates the operation of the contacts of a relay of FIG. 2, and also illustrates a waveform of a pulsating current of a source for treating the frames of FIGS. 1–3.

The contact roller 71 is connected to the cathode of a plating source 74 having positive and negative current pulses. A waveform of the plating source 74 is shown in FIG. 4. Advantageously, the source 74 is periodically reversed current of 60 hertz. This waveform may have a sinusoidal or square wave configuration with independently variable forward and reverse half waves. The positive part of the cycle is advantageously 100 times greater than the negative part of the cycle. The current density per frame 16 is about 13,600 milliamperes per square inch in the forward direction and about 136 milliamperes per square inch in the reverse direction.

While in the preferred embodiment of the invention periodically reversed plating waveforms are used, it is to be understood that the source 74 may also be direct current. However, periodically reversed waveforms have produced gold spots that have, upon the bonding of substrates thereto, resulted in bonds with greater bond strength than bonds made on lead frames plated with direct current.

The anode of the source 74 is electrically connected in parallel to each screen 54 (FIG. 3) in each orifice 55 of each plating tube 49 through a pair of normally open contacts 76 (FIG. 2) of an electrically operable controlling device, such as a relay 77. The connection to the screens 54 may be conveniently made through a hole in each cap 56.

Sensing Device

Figure 5:
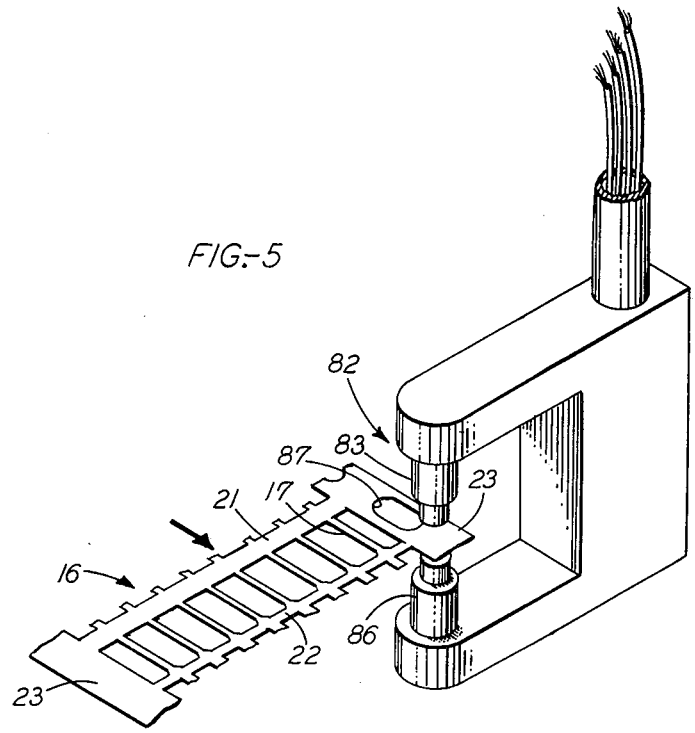
FIG. 5 is an enlarged perspective view of a sensing device of the apparatus of FIG. 2.

Next, the frames 16 are advanced under another guide roller 81 (FIG. 2) conventionally mounted to the channel 43 and then through a sensing device, designated generally by the numeral 82 and shown in FIGS. 2 and 5. The sensing device 82 is conventionally mounted to the channel 43. The sensing device 82 may be any of a number of different sensing devices known in the prior art and may be magnetic, electric, light or mechanical-motion responsive. Advantageously, however, it is light responsive and is an electro-optic device that includes a light source 83, energized by another power source 84, and a photocell 86.

As the interconnected frames 16 are advanced through the sensing device 82, a plurality of serially spaced apertures 87 (FIGS. 1 and 3) formed in one of the carrier strips 23 pass between the light source 83 and the photocell 86. The passing of each aperture 87 between the source 83 and photocell 86 permits the light of the source 83 to impinge on the photocell 86, while the carrier strip 23 between the apertures 87 interrupts such light. This sequential passing and interrupting of the light produces a control signal. The apertures 87 are so configured in, and spaced along, the carrier strip 23 that their length and spacing together with the speed of the interconnected frames 16 determine the duration of the control signal and, therefore, the time that electroplating subsequently takes place.

The sensing device 82 is adjusted so that any light passed by the apertures 24 is insufficient to operate the relay 77, the apertures 24 simply being used for other functions such as feeding, positioning, bonding or the like.

Electroplating

From the sensing device 82 (FIGS. 2 and 3) the interconnected lead frames 16 are advanced by the driven take-up reel 62 (FIG. 2) over the tank 31 and beneath the plating tubes 49 and then into contact with still another guide roller 85, conventionally mounted to the channel 43, and then finally to the reel 62. While the frames 16 may actually contact the caps 56 (FIG. 3) of the tubes 49, advantageously such frames 16 are spaced about 0.046 inches from the ends of the caps 56. The guide rollers 81 and 85 are provided with rims so as to laterally support the interconnected lead frames 16 as they pass over the tank 31 to hold them so that their central axis 79 (FIGS. 1 and 3) is aligned with the axis 57 (FIG. 3) of the orifices 55 of the plating tubes 49.

The advancing of the frames 16 beneath the plating tubes 49 results in the contacting of the frame 16 with the bath 33 which is ejected from the orifices 55 of the plating tubes 49. The aforementioned alignment of the axes 57 and 79 assures the contacting of the bath 33 with the frames 16 in the vicinity of the areas 28 (FIG. 1) to be plated. The center-to-center spacing of the plating tubes 49 is selected to conform to the center-to-center spacing of the selected areas 28 to be electroplated. The speed of the frames 16 is adjusted such that light from the source 83 passes through the aperture 87 to operate the relay 77 to maintain the contacts 76 closed to pass pulsating plating current from the source 74 to the anode screens 54 for time sufficient to electroplate such areas 28 when they are located under the orifices 55. Advantageously, this speed is 2 feet per minute for a center-to-center spacing of the frames 16 of 0.83 inches. Such electroplating results in the formation a sequential build-up each of the spot layers 27 on the areas 28 of the lead frames 16. Typically, the total build-up of the layers 27 on each of the areas 28 has a thickness between about 100 and 140 microinches.

After the electroplating of the spot layers 27, the frames 16 continue to advance and pass from beneath the orifices 55 of the plating tubes 49; whereupon, the sensing unit 82 and the relay 77 cooperate to disconnect the plating source 74 from the anode screens 54. This interrupts the electroplating as the electroplated spot layers 27 are advanced. Also, as these layers 27 are advanced, a new group of areas 28 to be electroplated are advanced under such orifices 55. Then, the sensing device 82 and the relay 77 cooperate to again connect the source 74 to the anode screens 54 to electroplate a new group of spot layers 27 on the new group of areas 28. This cycle of operation is carried out continuously as the frames 16 are continuously advanced by the reel 62 through the apparatus of FIG. 2. Such cycle is further illustrated in FIG. 4 which shows that as the contacts 76 close, the pulsating current from the source 74 passes through the anode screens 54.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. An apparatus for treating a portion of an article, comprising:

a treating member having an orifice;

means for flowing a treating medium out of the orifice;

a sensing device for producing a control signal;

means for continuously moving the article past the sensing device to produce the control signal and then past and spaced from the orifice and into contact with the treating medium, the movement of the article past the orifice resulting in relative motion between the article, the orifice and the treating medium, such treating medium contacting the portion of the article to be treated and other portions of the article not to be treated; and means responsive to the control signal for sequentially and electrically rendering effective the treating medium to treat with the medium the portion of the continuously moving article in contact with the medium while the medium is so rendered effective, whereby the remainder of the article is not treated.

2. The apparatus of claim 1, wherein the article is elongated, the flowing means continuously flows the treating medium out of the orifice, and as a result of the sequentially rendering effective the treating medium, a series of spaced portions of the article are treated.

3. The apparatus of claim 1, wherein a plurality of the treating members have inlets of varying sizes connected to a manifold so that the flow from each orifice of each member is substantially the same.

4. An apparatus for electroplating spots on a plurality of electrically conductive serially interconnected lead frames having an aperture associated with each lead frame, comprising:

a plurality of parallel plating tubes having orifices in the free ends thereof and being laterally aligned along an axis passing centrally through the orifices and being spaced from each other a distance equal to the spacing of the spots to be electroplated, the orifices having substantially the same configuration as the spots to be electroplated;

an open tank for holding a plating bath positioned beneath the orifices of the plating tubes;

means for continuously flowing the plating bath from the tank through the plating tubes, their orifices and back into the tank;

a sensing unit for producing a control signal;

a plating source having an anode and a cathode and having positive and negative current pulses;

an electrically operable controlling device having a pair of normally open contacts;

means for electrically connecting the anode of the source through the contacts to the plating tubes;

means for connecting the cathode of the source to the lead frames;

means for continuously moving the apertures of the lead frames past the sensing unit to produce the control signal and then for continously moving the lead frames beneath the orifices of the plating tubes and over the tank so that the central longitudinal axis of the lead frames is laterally aligned with that of the orifices, such movement of the lead frames resulting in the contacting of the plating bath with those portions of the lead frames beneath the orifices; and means responsive to the control signal of the sensing device for operating the controlling device to close the contacts to pass the current from the source through the plating tubes, the plating bath and the lead frames to electroplate those spots of the lead frames that are in contact with the fluid during the passing of the current, whereby the remainder of the lead frames are not electroplated.

5. The apparatus of claim 1, wherein the treating medium is an electrolyte and wherein the means for sequentially rendering effective the treating medium treats the article by sequentially passing electrical current through the article.

6. The apparatus of claim 5, wherein the current is periodically reversed.

* * * * *